United States Patent
Russell et al.

(10) Patent No.: US 7,067,859 B2
(45) Date of Patent: Jun. 27, 2006

(54) MULTI-LAYER STAGGERED POWER BUS LAYOUT DESIGN

(75) Inventors: Matthew Russell, Burnsville, MN (US); Dushyant Narayen, Sunnyvale, CA (US); Dongyi Zhou, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 50 days.

(21) Appl. No.: 10/648,054

(22) Filed: Aug. 26, 2003

(65) Prior Publication Data

US 2005/0046009 A1      Mar. 3, 2005

(51) Int. Cl.
*H01L 27/10*      (2006.01)
(52) U.S. Cl. .................. 257/207; 257/691; 257/700; 438/128
(58) Field of Classification Search ................ 257/691, 257/207, 700, 701; 438/128
See application file for complete search history.

(56) References Cited

U.S. PATENT DOCUMENTS

| | | | |
|---|---|---|---|
| 5,311,058 A | 5/1994 | Smolley | |
| 5,723,908 A | 3/1998 | Fuchida et al. | |
| 5,864,181 A * | 1/1999 | Keeth | 257/776 |
| 6,060,383 A * | 5/2000 | Nogami et al. | 438/622 |
| 6,194,768 B1 | 2/2001 | Gardner et al. | |
| 6,476,497 B1 | 11/2002 | Waldron et al. | |

* cited by examiner

*Primary Examiner*—Leonardo Andujar
(74) *Attorney, Agent, or Firm*—Trexler, Bushnell, Giangiorgi & Blackstone, Ltd.

(57) ABSTRACT

A bus layout design is provided which includes a first electrically conductive layer with a first bus and a second bus and a second electrically conductive layer with a first bus and a second bus. Vias are provided between the first electrically conductive layer and the second electrically conductive layer such that the first bus and the second bus of the first electrically conductive layer are electrically connected.

3 Claims, 1 Drawing Sheet

MULTI-LAYER STAGGERED POWER BUS LAYOUT DESIGN

BACKGROUND OF THE INVENTION

The present invention generally relates to the design of buses used to carry power and/or ground in semiconductor design or manufacturing, and more specifically relates to a multi-layered staggered power bus layout design.

As semiconductors become smaller, the input/output area is impacted. Although it is often desired to design a smaller input/output area, in order to maintain current carrying capabilities, the strips forming the power and ground buses must meet a minimum width requirement. The number of strips need for each power and ground bus is determined by the maximum metal width. A metal utilization upper limit determines how compact the buses can be placed within the layout. These limitations present two difficulties for the input/output bus layout. The metal utilization limit determines the extent to which the input/output can be reduced while the maximum metal width determines the current each strip of metal can carry.

Current methods used to resolve the metal utilization problem include using a single layer of metal or using multiple layers of metal. If only one layer of metal is used, generlly the input/output occupies a large area on the silicon. When multiple layers of metal are used, identical geometries are generally used on adjacent metal layers so that the input/output area can be reduced due to the fact that the power/ground current are carried by multiple layers of metal.

Problems occur when using these methods to resolve the maximum metal width and metal utilization problems. For example, current bottle necks occur in traditional wire bond, pad on I/O wire bond, and flip chip bond, therefore, electronic migration becomes an issue. In addition, tools need to be developed to account for different bonding schemes and to ensure each strip of the metal bus carries a certain amount of current. Currently, these tools are not available.

OBJECTS AND SUMMARY

An object of an embodiment of the present invention is to reduce the I/O area on the silicon.

Another object of an embodiment of the present invention is to provide multiple buses on a metal layer which are not electrically connected to each other.

Yet another object of an embodiment of the present invention to provide buses on a plurality of metal layers in which the buses on one metal layer have a different geometry than the buses on another metal layer.

A further object of an embodiment of the present invention is to reduce the occurrence of current bottlenecks.

Briefly, and in accordance with at least one of the foregoing objects, an embodiment of the present invention provides a multiple layer but layout design which consists of multiple metal layers with buses of different geometries. Although the buses on each layer are not connected to each other, a plurality of vias are provided between the metal layers to electrically connect the buses on each layer to each other.

BRIEF DESCRIPTION OF THE DRAWINGS

The present invention and the advantages thereof will become more apparent upon consideration of the following detailed description when taken in conjunction with the accompanying drawing, wherein like reference numerals represent like elements and wherein.

DESCRIPTION

Figure 1:
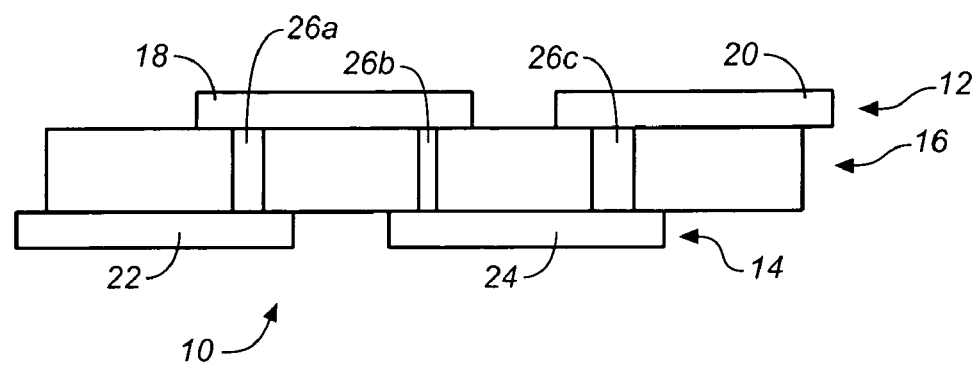
FIG. 1 is a cross sectional view of a multiple layer bus layout deign which is in accordance with an embodiment of the present invention.

While the invention may be susceptible to embodiment in different forms, there is shown in the drawing, and herein will be described in detail a specific embodiment with the understanding that the present disclosure is to be considered an exemplification of the principles of the invention, and is not intended to limit the invention to that as illustrated and described herein.

A portion of an integrated circuit 10 (i.e., a multiple layer bus layout design) in accordance with an embodiment of the present invention is shown in FIG. 1. The design is configured to reduce the I/O layer on the silicon and provide multiple buses on a metal layer which are not electrically connected to each other. The design provides buses on multiple layers, where the buses have different geometries. The design is also configured to reduce the occurrence of bottlenecks.

The integrated circuit 10, includes a first metal layer 12, a second metal layer 14, and an insulative layer 16 disposed between the first and second metal layers. Buses 18, 20 are provided on the first metal layer 12, however, buses 18, 20 are not conductively connected to each other on the first metal layer 12. Buses 22, 24 are provided on the second metal layer 14, however, buses 22, 24 are not conductively connected to each other on the second metal layer 14. Buses 18, 20 are staggered with respect to buses 22, 24 such that a portion of bus 18 overlaps a portion of bus 22 and a portion of bus 24. A portion of bus 20 also overlaps a portion of bus 24.

Vias 26a, 26b, 26c extend between the first metal layer 12 and the second metal layer 14. Via 26a extends between bus 18 on the first metal layer 12 and bus 22 on the second metal layer 14. Via 26b extends between bus 18 on the first metal layer 12 and bus 24 on the second metal layer 14. Via 26c extends between bus 20 on the first metal layer 12 and bus 24 on the second metal layer 24. By arranging the busses 18, 20, 22, 24 in this staggered manner, buses 18, 20, on the first metal layer 12 are electrically connected through bus 24 on the second metal layer 14 and buses 22, 24 on the second metal layer 14 are electrically connected through bus 18 on the first metal layer 12. Thus, although the buses 18, 20 on the first metal layer 12 are not connected together through the first metal layer 12, the current can freely pass through the vias 26a, 26b, 26c from bus 18 to bus 24 on the second metal layer 14 and return through the vias 26a, 26b, 26c to bus 20 on the first metal layer 12. The staggered design, therefore, resolves the conflict amongst a large current carrying capability requirement, upper limit for metal utilization, maximum metal width and limited I/O area.

The bus layout design of the present invention provides several advantages. The bus configuration shown in FIG. 1 can be used with all existing bonding schemes. No new software tool is needed to make designs to comply with metal utilization limits, metal width limit and electron migration limit. The buses on the adjacent metal layers are connected by vias in the overlapping area across the entire input/output width. Metals on the same layer can be placed closer together without violating metal utilization requirements due to the lack of metal interconnection on the same layer. As a result, therefore, input/output are requirement on the silicon is smaller. Thus, a smaller input/output area can be achieved without violating metal utilization, metal width and electron migration rules.

While an embodiment of the present invention is shown and described, it is envisioned that those skilled in the art may devise various modifications of the present invention without departing from the spirit and scope of the appended claims. For example, although only two metal layers are shown in FIG. 1, additional metal layers can be used if desired, and depending on the application.

What is claimed is:

1. A bus layout design comprising:
   a first electrically conductive layer including at least a first bus and a second bus,
   a second electrically conductive layer including at least a first bus and a second bus,
   an electrically insulating layer disposed between the first electrically conductive layer and the second electrically conductive laser,
   a plurality of vias through said electrically insulating layer conductively connecting said first electrically conductive layer and said second electrically conductive layer and arranged such that said first bus and said second bus of said first electrically conductive layer are electrically connected; and
   wherein said first and second electrically conductive layers and said vias are configured such that said second bus of said first electrically conductive layer is ultimately electrically connected to said first bus of said second electrically conductive layer yet said vias do not extend from said second bus of said first electrically conductive layer to said first bus of said second electrically conductive layer, wherein said plurality of vias connecting said first electrically conductive layer and said second electrically conductive layer are arranged such that said first bus and said second bus of said second electrically conductive layer are electrically connected.

2. The bus layout design claim 1, wherein said first and second bus of said first electrically conductive layer overlap said second bus of said second electrically conductive layer.

3. The bus layout design of claim 1 wherein said first and second buses of the first electrically conductive layer overlap said second bus of the second electrically conductive layer across the entire input/output width.

* * * * *